(12) United States Patent
Okumura

(10) Patent No.: US 6,784,774 B1
(45) Date of Patent: Aug. 31, 2004

(54) MAGNETIC SWITCH CAPABLE OF PERFORMING NORMAL DETECTION FOR A LONG PERIOD OF TIME

(75) Inventor: Hirofumi Okumura, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 10/782,089

(22) Filed: Feb. 18, 2004

(30) Foreign Application Priority Data

Feb. 24, 2003 (JP) ........................................ 2003-045418

(51) Int. Cl.[7] ................................................ H01H 9/00
(52) U.S. Cl. .................... 335/205; 280/735; 324/207.2; 324/207.26
(58) Field of Search ................................ 335/151–154, 335/205–207; 280/735; 324/207.11, 207.2, 207.24, 207.25, 207.26

(56) References Cited

U.S. PATENT DOCUMENTS

| | | | | | |
|---|---|---|---|---|---|
| 5,967,549 | A | * | 10/1999 | Allen et al. ................. | 280/735 |
| 6,053,529 | A | | 4/2000 | Frusti et al. | |
| 6,095,555 | A | * | 8/2000 | Becker et al. ............... | 280/735 |
| 6,561,544 | B1 | * | 5/2003 | Clancy et al. ............... | 280/735 |
| 6,593,735 | B2 | * | 7/2003 | Becker .................. | 324/207.26 |

* cited by examiner

*Primary Examiner*—Ramon M. Barrera
(74) *Attorney, Agent, or Firm*—Beyer Weaver & Thomas, LLP.

(57) ABSTRACT

A magnetic switch hardly affected by an external magnetic field even if a cheap magnet is used and capable of performing magnetic detection for a long period of time is provided. A first magnetic path L1 and a second magnetic path L2 in which a stationary rail 13 and a movable rail 14 lead magnetic fluxes are formed in a non-shielding state where magnetism shielding 18 is not interposed in a gap G between a magnet M and a Hall element H to secure the number of magnetic fluxes that pass through the Hall element H. Therefore, it is not necessary to use a costly rare earth magnet having a large number of generated magnetic fluxes. In n shielding state where the magnetism shielding 18 is interposed in the gap G, the first magnetic path L1 is shielded. As a result, the number of magnetic fluxes that pass through the Hall element H is almost zero. Since the magnet M and the Hall element H are covered with the stationary rail 13 and the movable rail 14, the magnetic switch is hardly affected by the external magnetic field.

5 Claims, 4 Drawing Sheets

MAGNETIC SWITCH CAPABLE OF PERFORMING NORMAL DETECTION FOR A LONG PERIOD OF TIME

BACKGROUND OF THE INVENTION

1. Field of the Invention

The present invention relates to a magnetic switch including a magnet and a Hall element, and particularly, to a magnetic switch with excellent sensitivity, which is hardly affected by an external magnetic field, even if a cheap magnet with a small-number of magnetic fluxes is used.

2. Description of the Related Art

The invention described in Patent Document 1 is noted as an example of conventional magnetic detection switches. As described in FIGS. 2 to 7 of Patent Document 1, the magnetic detection switch detects the position of a seat, freely movable back and forth, provided in the body of a vehicle.

The seat is fixed to a movable rail provided so as to be movable back and forth with respect to a stationary rail fixed to the floor of the body of the vehicle. A laterally extending support member is provided on the outside of the stationary rail. A magnetic sensor is fixed to the support member. The magnetic sensor has a detecting unit in which a pair of facing pieces is made of a resin material and faces each other so as to with a U-shaped section. A magnet is buried in one facing piece. A Hall element is provided in the other facing piece. A flange having an L-shaped section is provided on the side of the movable rail. The tip of the flange is adapted to be capable of entering the detecting unit of the magnetic sensor.

The tip of the flange is not interposed in the detecting unit of the magnetic sensor when the seat is moved backward. The tip of the flange is interposed in the detecting unit of the magnetic sensor when the seat is moved to the foremost position. At this time, it is possible to detect that the seat is moved to the foremost position by shield the magnetic fluxes generated by the magnet from reaching the Hall element.

[Patent Document 1]

U.S. Pat. No. 6053529

However, since the magnetic sensor described in Patent Document 1 has a structure in which an exclusive magnetic path through which magnetic fluxes pass does not exist between the N pole and the S pole of the magnet, that is, an open loop structure, the magnet is demagnetized, when it is used for a long period of time, thus reducing the number of magnetic fluxes that pass through the Hall element. Thus, a magnetic sensor is conceivable that is operated by reducing the sensitivity of the Hall element to detect only a small number of magnetic fluxes. However, in this case, the magnetic sensor may erroneously operate due to the influence of a small external magnetic field; in particular, a speaker of onboard acoustic equipment may be provided near the floor on which the magnetic sensor is provided. As a result, the magnetic sensor may be affected by the external magnetic field generated by the speaker, which result in an erroneous operation.

Further, in order to use the magnetic sensor with improved sensitivity of the Hall element, a rare earth magnet with a large number of generated magnetic fluxes may be used. However, in this case, there is a problem that the cost of the magnetic sensor jumps.

Since the magnetic sensor is arranged on the outside of a rail, dusts (metal pieces) in the vehicle easily gathers in the detecting unit having the U-shaped section. Therefore, the magnetic fluxes that pass through the detecting unit are shielded by the metal pieces in the dusts. As a result, the magnetic sensor erroneously operates and cannot correctly detect the position of the seat.

SUMMARY OF THE INVENTION

In order to solve the above problems, it is an object of the present invention to provide a magnetic switch that is hardly affected by an external magnetic field, even if a cheap magnet having a small number of generated magnetic fluxes is used, and that is capable of performing normal magnetic detection for a long period of time.

According to the present invention, a magnetic switch comprises magnetism detecting means having a Hall element that faces a magnet through a gap and magnetism shielding means provided so as to freely enter and exit the gap. The external surface of the magnetism detecting means is covered with a case made of a magnetic material.

According to the present invention, since a magnetic path functioning as a passageway of magnetic fluxes is formed between the magnet and the Hall element, the magnetic lines of force generated by the magnet easily form a closed loop easily. Therefore, it is possible to secure the required number of magnetic fluxes. It is also possible to prevent demagnetization of the magnet at an early stage. Further, since the Hall element is provided in the magnetic path, the sensitivity of the Hall element does not necessarily deteriorate, that is, it is possible to maintain the sensitivity to larger than a predetermined level. As a result, it is possible to reduce the likelihood of the erroneous operation caused by an external magnetic field. Further, since the external surface of the magnetic switch is covered with a magnetic material, the magnetic switch is hardly affected by the external magnetic field. Therefore, it is possible to provide a magnetic switch with a high degree of precision.

The magnetism shielding means is preferably made of a magnetic material.

According to the above structure, in an shielding state where magnetism shielding means is interposed between the magnet and the Hall element, it is possible to shield magnetic fluxes in the magnetic path, which is expected to pass through the Hall element, thus making the number of magnetic fluxes almost zero, and to form a closed magnetic path between the path that is expected to pass through the Hall element and the path that does not pass through the Hall element. Therefore, it is possible to prevent demagnetization of the magnet even if the shielding state continues for a long period of time.

For example, the magnetic switch may comprise a stationary rail fixed to the floor, a movable rail guided by the stationary rail and provided so as to be freely movable, and a seat fixed to the movable rail and capable of being moved back and forth along with the movable rail. The magnetism detecting means is provided in either the stationary rail or the movable rail and the magnetism shielding means is provided in the other.

Otherwise, the magnetic switch may comprise a vehicle body and a stand for supporting the vehicle body. The magnetism detecting means is provided in one of the vehicle body and the stand and the magnetism shielding means is provided in the other.

Moreover, the magnet and the Hall element are preferably integrally received in the case.

Since magnetism detecting means is compact, it is possible to easily mount the magnetism detecting means in a predetermined position of the movable rail.

BRIEF DESCRIPTION OF THE DRAWINGS

FIG. 4 illustrates aspects of a magnetic field in a magnetic detection switch. FIG. 5 illustrates another embodiment of the magnetic switch.

DESCRIPTION OF THE PREFERRED EMBODIMENTS

Figure 1:
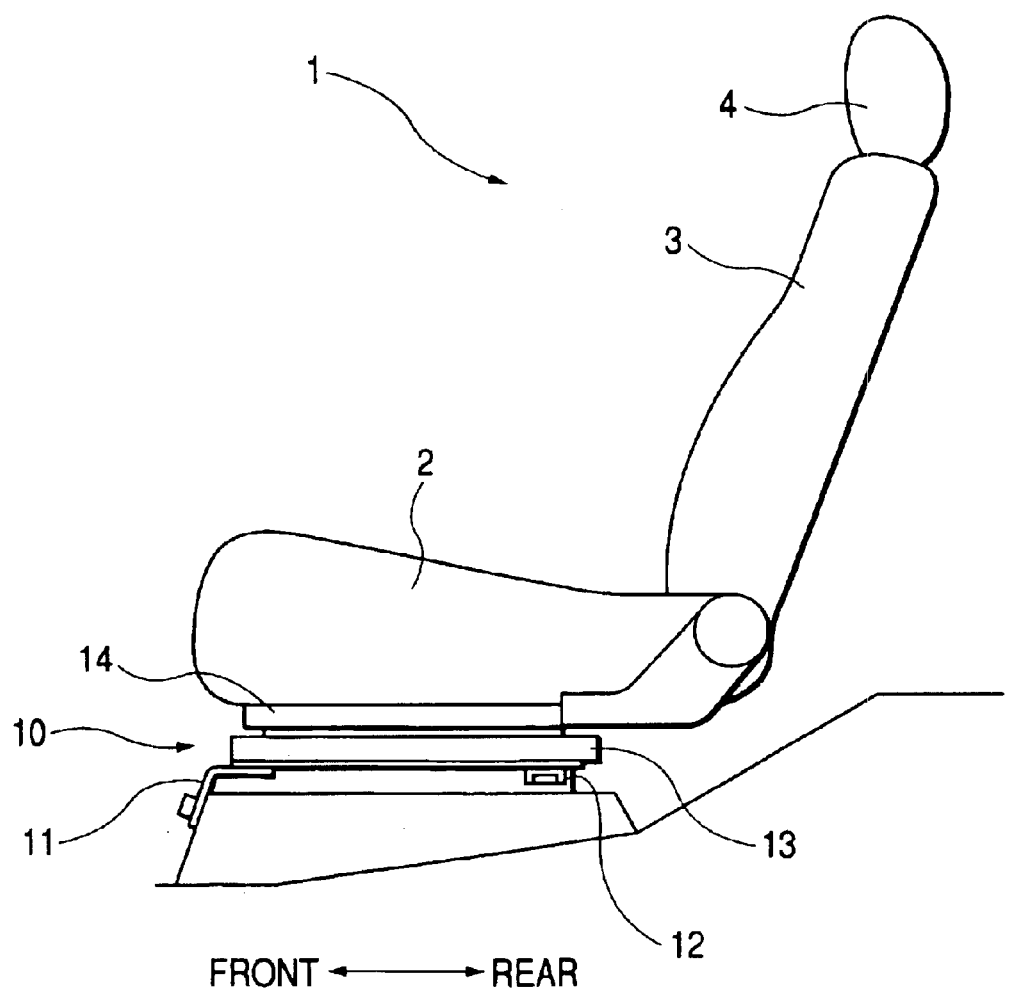
FIG. 1 is a side view illustrating an onboard seat in which a magnetic switch is used according to an embodiment of the present invention.
Figure 2:
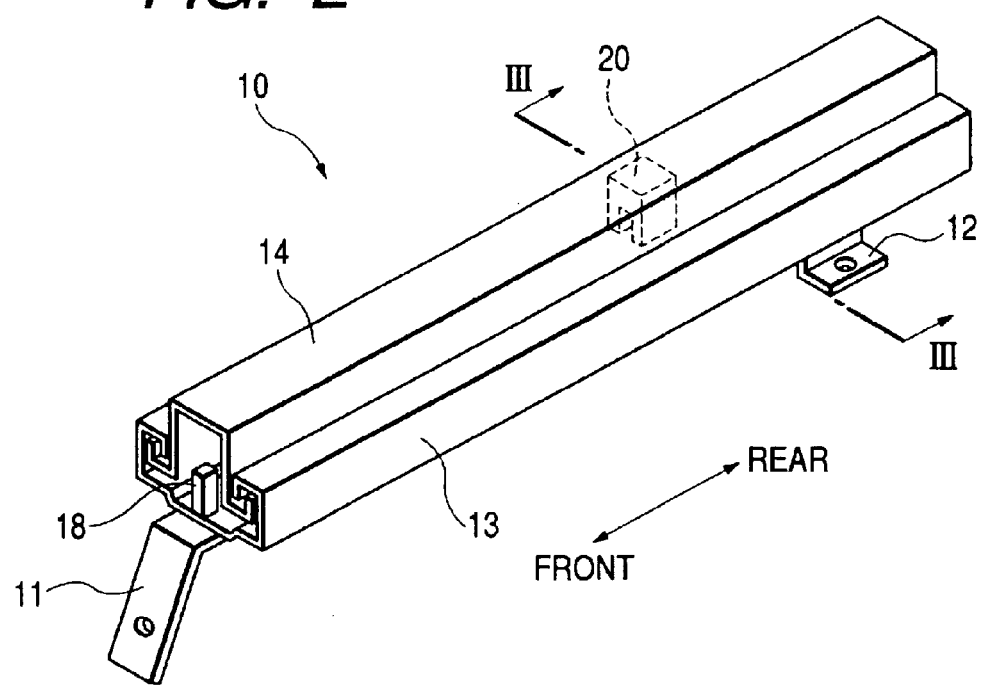
FIG. 2 is a perspective view illustrating a seat-moving mechanism.
Figure 3:
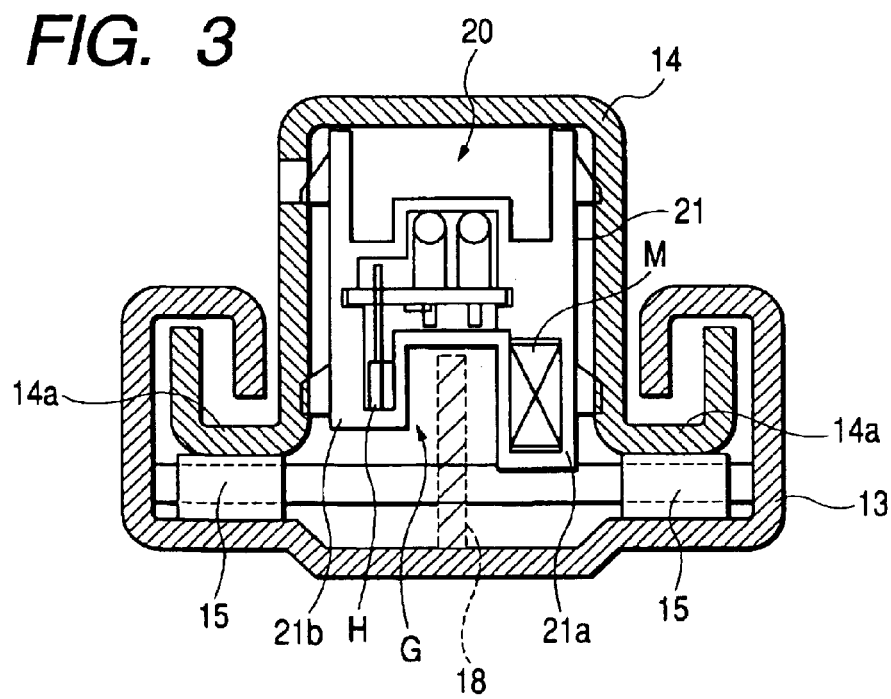
FIG. 3 is a sectional view taken along the line III—III of FIG. 2, which illustrates a magnetic switch provided in the seat-moving mechanism.
Figure 4A:
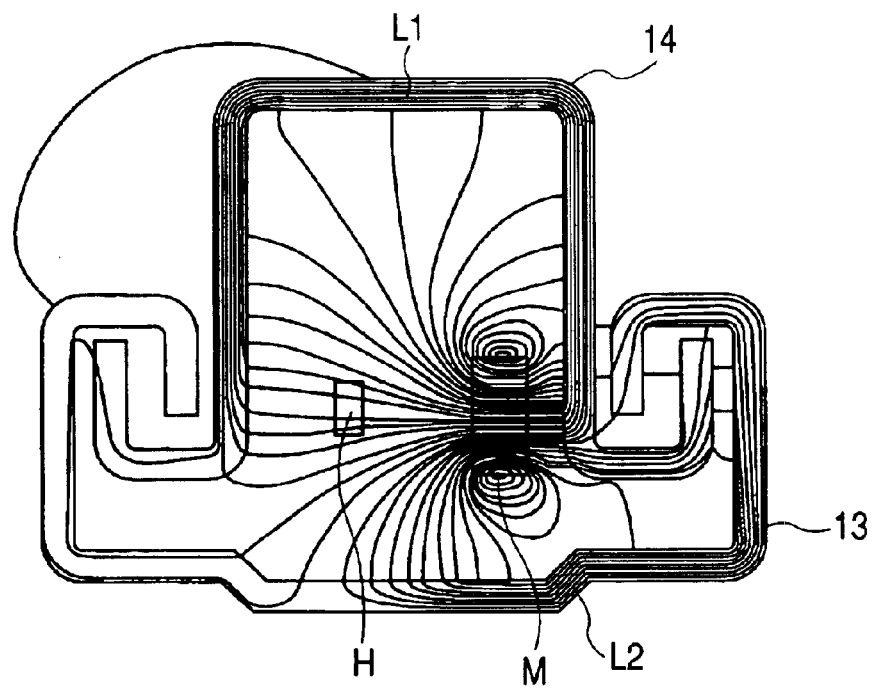
FIG. 4A illustrates a non-shielding state in which a shielding member is not interposed.
Figure 4B:
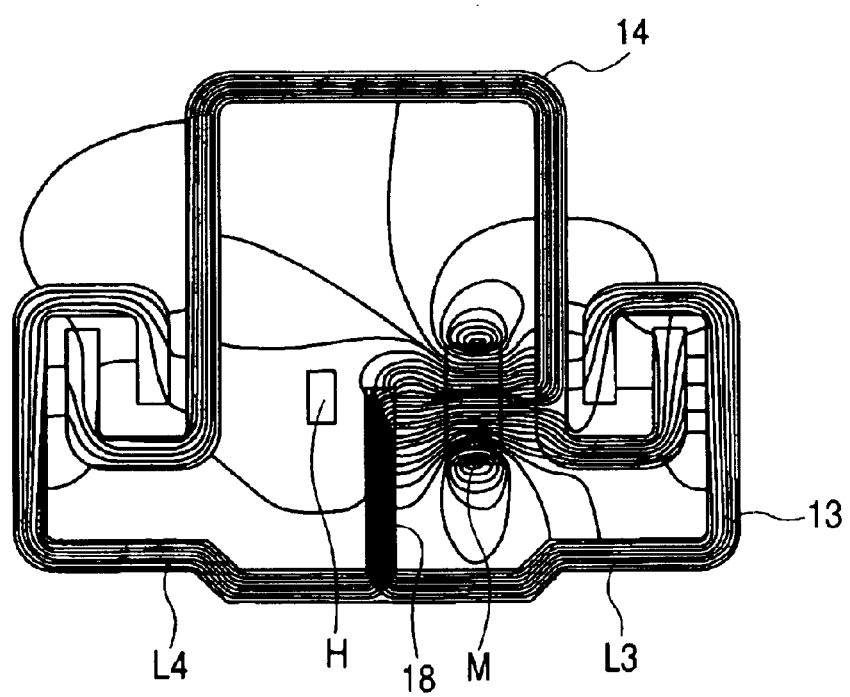
FIG. 4B illustrates a shielding state in which the shielding member is interposed.

FIG. 1 is a side view illustrating an onboard seat in which a magnetic switch is used according to an embodiment of the present invention. FIG. 2 is a perspective view illustrating a seat-moving mechanism. FIG. 3 is a sectional view taken along the line III—III, which illustrates a magnetic switch provided in the seat-moving mechanism. FIG. 4 illustrates aspects of magnetic fields in a magnetic detection switch. FIG. 4A illustrates a non-shielding state in which a shielding member is not interposed. FIG. 4B illustrates a shielding state in which the shielding member is interposed.

As illustrated in FIGS. 1 to 3, the magnetic switch detects the position of a seat in a vehicle.

As illustrated in FIG. 1, a seat 1 includes a chair 2, a back 3, and a head 4 and is mounted on a seat-moving mechanism 10 provided on the floor of the vehicle. A handle (not shown) is provided in front of the seat 1 if the seat 1 is a driver's seat. A dashboard (not shown) is provided in front of the seat 1 if the seat 1 is the assistant driver's seat. An air bag device (not shown) is provided in the center of the handle and in the dashboard. Should the vehicle collides with another vehicle, the air bag device operates to rapidly expand the air bag in the air bag device.

The seat-moving mechanism 10 includes a stationary rail 13 fixed to the floor through fixing members 11 and 12 and a movable rail 14 provided to be fitted with the stationary rail 13. The stationary rail 13 and the movable rail 14 are made of a metal containing a magnetic material, such as iron or nickel. As illustrated in FIG. 3, movable rollers 15 that freely rotate are provided inside the stationary rail 13. A pair of supporting parts 14a is bent in the form of a letter "U" at the ends of the movable rail 14 and is put on the movable rollers 15. Therefore, the movable rail 14 may be freely moved back and forth with respect to the stationary rail 13. The seat 1 is connected and fixed at the bottom of the chair 2 thereof to the movable rail 14. Therefore, it is possible to control the position of the seat 1 in its forward and backward direction.

The seat-moving mechanism 10 is provided with regulating means (not shown) for regulating the forward movement of the movable rail 14 when the amount of forward movement of the seat 1 reaches a certain point (when the seat 1 is located at its foremost position). Also, a locking member (not shown) for locking the movable rail 14 in the position where the forward and backward movement of the seat 1 is prevented and an unlocking member (not shown) for unlocking the movable rail 14 to allow the movement of the movable rail 14 are provided.

As illustrated in FIG. 2, magnetism detecting means 20 is provided inside the movable rail 14. The magnetism detecting means 20 is covered with a case 21 made of a resin material. A pair of facing pieces 21a and 21b is provided underneath the case 21. A magnet M is provided inside the one facing piece 21a, and a Hall element H is provided inside the other facing piece 21b. The magnet M is magnetized in such a manner that one surface (the illustrated right end) thereof is N pole and the other surface (the illustrated left end) thereof is S pole. A gap G is provided between the facing piece 21a and the facing piece 21b.

Magnetism shielding means 18 is provided at the front position of the stationary rail 13. The magnetism shielding means 18, made of a magnetic material, such as iron or nickel, is adapted to enter the gap G of the magnetism detecting means 20.

When the seat 1 is moved to the foremost position, regulating means (not shown) operates to regulate the forward movement of the movable rail 14. At this time, as illustrated in FIG. 3, the magnetism shielding means 18 is interposed in the gap G of the magnetism detecting means 20.

When the seat 1 is located other than the foremost position, the magnetism shielding means 18 is not interposed in the gap G of the magnetism detecting means 20.

As illustrated in FIG. 4A, in a state where the magnetism shielding means 18 is not interposed in the gap G of the magnetism detecting means 20 (the non-shielding state), a first magnetic path L1 is formed. In the first magnetic path L1, the magnetic fluxes generated by one surface (the N pole) of the magnet M enter the movable rail 14 from one side of the movable rail 14 made of the magnetic material, come out from the other side of the movable rail 14 through movable rail, and reach the other surface (the S pole) of the magnet M. At the same time, a second magnetic path L2 is formed. In the second magnetic path L2, the magnetic fluxes that enter the movable rail 14 from one side thereof comes out from the movable rail 14, enter the side of the stationary rail 13, pass through the stationary rail 13, come out from the bottom of the stationary rail 13, and reach the other surface (the S pole) of the magnet M. The Hall element H is provided to be located in the course of the first magnetic path L1 and is set to the ON state in the non-shielding state.

As illustrated in FIG. 4B, in a state where the magnetism shielding means 18 is interposed in the gap G of the magnetism detecting means 20 (the shielding state), since the magnetism shielding means 18 is provided between the magnet M and the Hall element H to face them, magnetic paths L3 and L4 are formed. In the magnetic paths L3 and L4, the magnetic fluxes generated by one surface (the N pole) of the magnet M enter the movable rail 14 from one side thereof, enter both sides of the stationary rail 13 from both sides of the movable rail 14, pass through the stationary rail 13, are transmitted to the magnetism shielding means 18 provided on the bottom of the stationary rail 13, come out from the tip of magnetism shielding means 18, and reach the other surface (the S pole) of the magnet M. At the same time, the magnetism shielding means 18 can shield the first magnetic path L1, making the number of magnetic fluxes that pass through the Hall element H almost zero. Therefore, the output of the Hall element H is set to the OFF state in the shielding state.

As mentioned above, the magnetism shielding means 18 and the magnetism detecting means 20 constitute a magnetic switch for switching the output thereof in response to the presence or absence of the magnetic fluxes that pass through the Hall element H.

In the non-shielding state, the first and second magnetic paths L1 and L2 that lead the magnetic fluxes generated by the N pole of the magnet M to the S pole are formed and the Hall element H is provided in one magnetic path, that is, the first magnetic path L1. Therefore, it is possible to easily secure the required number of magnetic fluxes for driving the Hall element H. As a result, it is possible to detect that the magnetism shielding means 18 is not interposed between the magnet M and the Hall element H, that is, that the seat 1 is not located at its foremost position without deteriorating the sensitivity of the Hall element H.

In the shielding state, since it is possible to make the number of magnetic fluxes that pass through the Hall element H almost zero, it is possible to detect when the magnetism shielding means 18 is interposed between the magnet M and the Hall element H and when the seat 1 is located at its foremost position. Therefore, it is possible to prevent injuries due to the large and sudden expansion of an air bag by setting the speed at which the air bag of the air bag device expands to be low.

According to the above-mentioned simple structure, it is possible to correctly detect whether the seat 1 is located at its foremost position, to effectively ensure a small number of generated magnetic fluxes of the magnet M, and to reduce the loss of the magnetic fluxes. Therefore, it is not necessary to use a costly rare earth magnet. Further, since the external surface of the case 21 is covered with the seat-moving mechanism 10 made of a magnetic material, it is possible to prevent the demagnetization of the magnet M at an early stage. Therefore, it is possible to provide a magnetic switch capable of normally detecting the position of a seat for a long period of time.

Further, since it is possible to provide the magnetism detecting means 20 and the magnetism shielding means 18 inside the seat-moving mechanism 10 (the stationary rail 13 and the movable rail 14) made of a magnetic material, it is possible to make a magnetic switch that is hardly affected by an external magnetic field and to prevent the magnetic switch from erroneously operating.

Moreover, since the magnetism detecting means 20 and the magnetism shielding means 18 are not exposed to the outside of the seat-moving mechanism 10, it is possible to prevent metal pieces in the dust from entering the gap G and to prevent the magnetic switch from erroneously operating. Furthermore, since the magnetism detecting means 20 and the magnetism shielding means 18 are receive in the seat-moving mechanism 10 and do not protrude to the outside unlike in the conventional technology, the magnetism detecting means 20 and the magnetism shielding means 18 do not serve as obstacles.

As mentioned above, the magnetism detecting means 20 is provided in the movable rail 14 and the magnetism shielding means 18 is provided in the stationary rail 13. However, on the contrary, the magnetism detecting means 20 may be provided in the stationary rail 13, and the magnetism shielding means 18 may be provided in the movable rail 14.

The magnetism shielding means 18 is provided at the front position. However, on the contrary, the magnetism shielding means 18 may be longitudinally provided at any position other than the front position in the form of a wall and nothing may be provided at the front position. In this case, the polarities of the output of the Hall element H in the non-shielding state and in the shielding state are reversed. That is, the output of the Hall element H is in the OFF state in the non-shielding state, and is in the ON state in the shielding state.

Figure 5A:
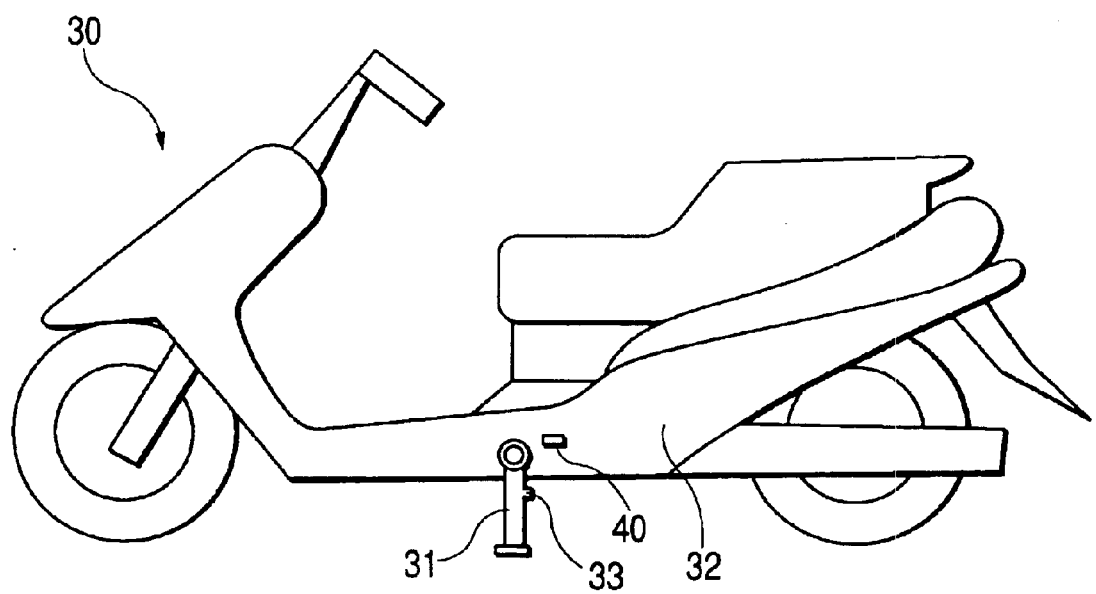
FIG. 5A is a side view illustrating a two-wheeled vehicle.
Figure 5B:
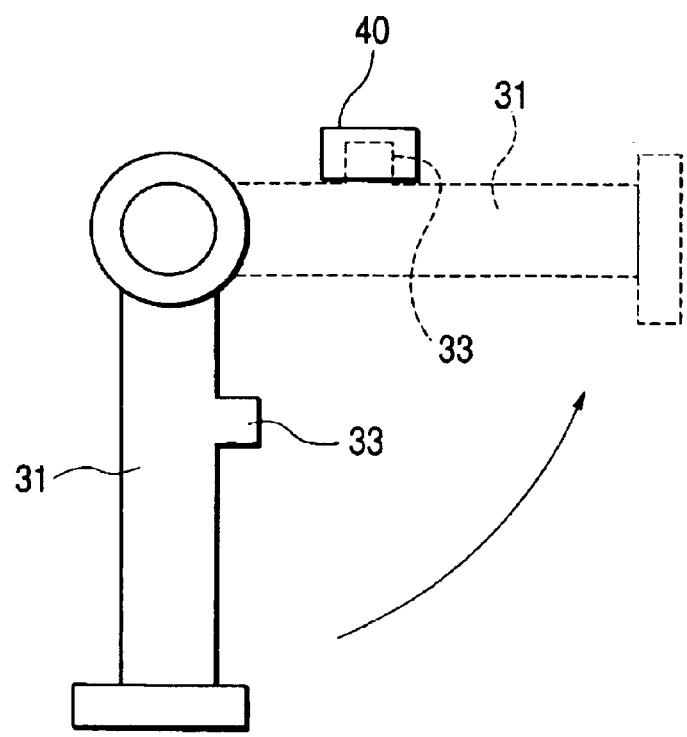
FIG. 5B is an enlarged side view illustrating a stand of the two-wheeled vehicle.

FIG. 5 illustrates another embodiment of the magnetic switch. FIG. 5A is a side view illustrating a two-wheeled vehicle. FIG. 5B is an enlarged side view illustrating a stand of the two-wheeled vehicle.

As illustrated in FIGS. 5A and 5B, a stand 31 for supporting the two-wheeled vehicle is provided in a two-wheeled vehicle 30 such as a bicycle or a motorcycle. As illustrated in FIG. 5B, the stand 31 attached to the body frame 32 of the two-wheeled vehicle 30 can rotate between an upright state indicated by a solid line and a horizontal state indicated by a dotted line. It is possible to stop the two-wheeled vehicle 30 by making the stand 31 upright and to travel with the two-wheeled vehicle 30 by making the stand 31 horizontal.

Magnetism shielding means 33 that protrudes to the direction where the stand 31 rotates from the vertical state to the horizontal state is integrated with the stand 31. The stand 31 and the magnetism shielding means 33 are made of a magnetic material such as iron.

Magnetism detecting means 40 is provided in the body frame 32. The structure of the magnetism detecting means 40 is almost the same as that of the magnetism detecting means 20. That is, a pair of facing pieces is mounted so as to face downward and a magnet and a Hall element are provided in each facing piece so that a gap is provided between the magnet and the Hall element. The magnet and the Hall element are received in a resin case and the external surface (excluding the portion that faces the facing pieces) is covered with a magnetic material such as iron.

As indicated in FIG. 5B by a solid line, when the stand 31 is in the upright state, in the magnetism detecting means 40, a magnetic path is formed. In the magnetic path, the magnetic fluxes generated by the N pole that is one surface of the magnet pass through the gap, the Hall element, and the inside of the case that covers the external surface of the magnetism detecting means 40 and reach the S pole, that is, the other surface of the magnet. Therefore, it is possible to secure the number of magnetic fluxes.

On the other hand, as illustrated in FIG. 5B, when the stand 31 is in the horizontal state, since the magnetism shielding means 33 of the stand 31 enters the gap G of the magnetism detecting means 40, the magnetic path is shielded similarly to the case illustrated in FIG. 4B. As a result, the number of magnetic fluxes that pass through the Hall element becomes almost zero.

Therefore, it is possible to detect whether the stand 31 is in the vertical or horizontal state by sensing the output of the Hall element. When the stand 31 is in the vertical state, the engine is not started. As a result, it is possible to prevent the two-wheeled vehicle from traveling in a dangerous state where the stand 31 erects.

As mentioned above, since it is possible to sense the state of the stand 31 by non-contact sensing means, the sensing means hardly breaks down or erroneously operates. Further, since it is possible to prevent demagnetization of the magnet by covering the external surface of the magnetism detecting means 40 with a case made of a magnetic material, it is possible to sense the state of the stand 31 for a long period of time.

The magnetism detecting means may be provided in the stand, and the magnetism shielding means may be provided in the body frame.

As mentioned above, according to the present invention, since it is possible to secure the number of magnetic fluxes that pass through the Hall element, the sensitivity of the Hall element does not necessarily deteriorate. Therefore, it is not necessary to use a rare earth magnet having a large number of generated magnetic fluxes and a cheap magnetic switch may be provided. Further, since the magnetism detecting means is covered with the magnetic material, it is possible to make a magnetic switch that is hardly affected by the external magnetic field.

What is claimed is:

1. A magnetic switch, comprising:

magnetism detecting means having a Hall element that faces a magnet through a gap; and magnetism shielding means provided so as to freely enter and exit the gap, wherein the external surface of the magnetism detecting means is covered with a case made of a magnetic material.

2. The magnetic switch according to claim 1, wherein the magnetism shielding means is made of a magnetic material.

3. The magnetic switch according to claim 1, further comprising:

a stationary rail fixed to a floor;

a movable rail guided by the stationary rail and provided so as to be freely movable; and a seat fixed to the movable rail and capable of being moved back and forth along with the movable rail, wherein the magnetism detecting means is provided in either the stationary rail or the movable rail, and the magnetism shielding means is provided in the other.

4. The magnetic switch according to claim 1, further comprising:

a vehicle body; and a stand for supporting the vehicle body, wherein the magnetism detecting means is provided in either the vehicle body or the stand, or the magnetism shielding means is provided in the other.

5. The magnetic switch according to claim 1, wherein the magnet and the Hall element are integrally received in the case.

* * * * *